United States Patent
Kondo et al.

(10) Patent No.: US 9,479,152 B2
(45) Date of Patent: Oct. 25, 2016

(54) SEMICONDUCTOR DEVICE AND METHOD FOR DRIVING SEMICONDUCTOR DEVICE

(71) Applicant: Semiconductor Energy Laboratory Co., Ltd., Atsugi-shi, Kanagawa-ken (JP)

(72) Inventors: Toshikazu Kondo, Kanagawa (JP); Jun Koyama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 187 days.

(21) Appl. No.: 13/894,783

(22) Filed: May 15, 2013

(65) Prior Publication Data

US 2013/0315021 A1 Nov. 28, 2013

(30) Foreign Application Priority Data

May 25, 2012 (JP) ................. 2012-119162

(51) Int. Cl.
*H03K 17/00* (2006.01)
*G11C 5/14* (2006.01)
*H03K 19/00* (2006.01)

(52) U.S. Cl.
CPC ............... *H03K 17/00* (2013.01); *G11C 5/148* (2013.01); *H03K 19/0008* (2013.01); *Y10T 307/858* (2015.04)

(58) Field of Classification Search
CPC ............ G11C 14/00; G11C 5/14; G06F 1/32
USPC ......... 365/226, 227, 228; 713/300, 320, 324
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

(Continued)

*Primary Examiner* — Richard Elms
*Assistant Examiner* — Jerome Leboeuf
(74) *Attorney, Agent, or Firm* — Fish & Richardson P.C.

(57) ABSTRACT

A semiconductor device capable of simply performing power gating and a driving method thereof are provided. Power gating is started passively (automatically in the case of satisfying predetermined conditions). Specifically, the semiconductor device includes a transistor for selecting whether a power source voltage is supplied or not to a functional circuit. The power gating is started by turning off the transistor in the case where a voltage between a source and a drain is less than or equal to a predetermined voltage. Therefore, complicated operation is not needed at the time of starting power gating. Specifically, it is possible to start power gating without a process for predicting the timing at which an arithmetic operation performed in the functional circuit is terminated. As a result, it is possible to start power gating easily.

8 Claims, 6 Drawing Sheets

(56) References Cited

U.S. PATENT DOCUMENTS

| | | | |
|---|---|---|---|
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,284,137 | B2 * | 10/2007 | Clark et al. ............... 713/300 |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 8,575,985 | B2 * | 11/2013 | Ohmaru et al. .............. 327/208 |
| 8,686,416 | B2 | 4/2014 | Honda et al. |
| 8,835,921 | B2 | 9/2014 | Honda et al. |
| 9,196,690 | B2 | 11/2015 | Honda et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0151674 | A1 * | 6/2008 | Ohata et al. .............. 365/227 |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2011/0096578 | A1 * | 4/2011 | Fang et al. .................... 363/127 |
| 2012/0032730 | A1 | 2/2012 | Koyama |
| 2012/0063203 | A1 * | 3/2012 | Matsuzaki ............ G11C 11/404 365/149 |
| 2012/0170355 | A1 * | 7/2012 | Ohmaru et al. ............. 365/149 |
| 2012/0230138 | A1 * | 9/2012 | Endo ............................ 365/203 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | 2004/114391 A1 | 12/2004 |

OTHER PUBLICATIONS

Orita, M et al., "Amorphous transparent conductive oxide InGaO3(ZnO)m (m>4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by

(56) References Cited

OTHER PUBLICATIONS

Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 with Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using Cg—Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MoO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3—A2O3—Bo

(56) References Cited

OTHER PUBLICATIONS

Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits, 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

* cited by examiner

SEMICONDUCTOR DEVICE AND METHOD FOR DRIVING SEMICONDUCTOR DEVICE

BACKGROUND OF THE INVENTION

1. Field of the Invention

The present invention relates to a semiconductor device and a driving method thereof. Specifically, the present invention relates to a semiconductor device capable of performing power gating and a driving method thereof. Note that a semiconductor device in this specification refers to a device that operates by utilizing semiconductor characteristics.

2. Description of the Related Art

Attention has been paid to power gating as a technique for reducing power consumption of a central processing unit (CPU) or the like. The power gating is a technique for stopping supply of a power source voltage to part or whole of the CPU when part or whole of the CPU does not operate. Accordingly, it is possible to suppress static power consumption (power consumed for maintaining the state of part or whole of the CPU).

For example, Patent Document 1 discloses a semiconductor device in which supply of a power source voltage to a functional circuit (a memory circuit) is controlled by switching a transistor (a power-gating transistor) whose channel is formed in an oxide semiconductor layer. Specifically, in the semiconductor device disclosed in Patent Document 1, power gating is performed as follows: switching or the like of the transistor (power-gating transistor) is controlled on the basis of various signals output from a control circuit (a power-gating control circuit).

REFERENCE

[Patent Document 1] United States Patent Application Publication No. 2012/0032730

SUMMARY OF THE INVENTION

In the semiconductor device disclosed in Patent Document 1, various signals are needed and these signals need to be actively controlled by the control circuit when power gating is performed. Thus, one embodiment of the present invention is to provide a semiconductor device capable of simply performing power gating and a driving method thereof.

The main point of a semiconductor device of one embodiment of the present invention is that power gating is started passively (automatically in the case of satisfying predetermined conditions). Specifically, the semiconductor device of one embodiment of the present invention includes a transistor for selecting whether a power source voltage is supplied or not to a functional circuit. The power gating is started by turning off the transistor in the case where a voltage between a source and a drain of the transistor is less than or equal to a predetermined voltage.

Note that the voltage between the source and the drain of the transistor is influenced by a shoot-through current generated in the functional circuit. The shoot-through current is generated when logic states of various nodes included in the functional circuit are changed. Thus, it is possible in the semiconductor device of one embodiment of the present invention to determine the operation state of the functional circuit by detecting the voltage between the source and the drain of the transistor and to start power gating when the functional circuit is determined to be in a non-operation state (the logic states of the various nodes are held).

For example, one embodiment of the present invention is a semiconductor device including a transistor, a functional circuit where whether a power source voltage is supplied or not is selected by switching the transistor, a detection circuit for detecting a voltage between a source and a drain of the transistor, and a control circuit for stopping supply of a power source voltage to the functional circuit by turning off the transistor in the case where the voltage detected by the detection circuit is less than or equal to a predetermined voltage.

Another embodiment of the present invention is a method for driving a semiconductor device, where power gating is performed by turning off a transistor, in which the power gating is started in the case where a voltage between a source and a drain of the transistor is less than or equal to a predetermined voltage.

In the semiconductor device of one embodiment of the present invention, supply of a power source voltage to the functional circuit is stopped by turning off the transistor in the case where the voltage detected by the detection circuit is less than or equal to the predetermined voltage. Therefore, complicated operation is not needed at the time of starting power gating. Specifically, it is possible to start power gating without a process for predicting the timing at which an arithmetic operation performed in the functional circuit is terminated. As a result, it is possible to start power gating easily in the semiconductor device of one embodiment of the present invention.

DETAILED DESCRIPTION OF THE INVENTION

One embodiment of the present invention will be described below in detail. Note that the present invention is not limited to the description below and a variety of changes can be made without departing from the spirit and scope of the present invention. Therefore, the present invention should not be construed as being limited to the description below.

<1. Semiconductor Device and Driving Method Thereof>

First, a semiconductor device of one embodiment of the present invention will be described with reference to FIGS. 1A to 1C. Note that FIG. 1A is a diagram showing a structure example of the semiconductor device, and FIGS. 1B and 1C are flow charts showing examples of the driving method thereof.

Figure 1A:
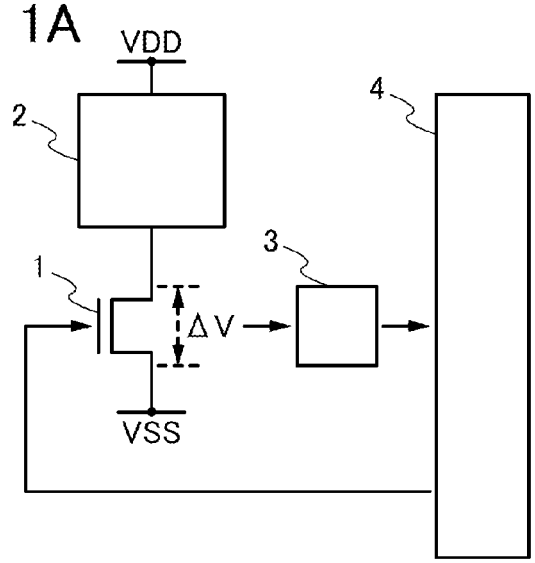
FIG. 1A is a diagram showing a structure example of a semiconductor device.

A semiconductor device shown in FIG. 1A includes a transistor 1, a functional circuit 2 where whether a power source voltage (a voltage between a high power source potential VDD and a low power source potential VSS) is supplied or not is selected by switching the transistor 1, a detection circuit 3 for detecting a voltage (ΔV) between a source and a drain of the transistor 1, and a control circuit 4 for stopping supply of a power source voltage to the functional circuit 2 by turning off the transistor 1 in the case where the voltage detected by the detection circuit 3 is less than or equal to the predetermined voltage. Note that in the semiconductor device shown in FIG. 1A, the transistor 1 is provided on the low power source potential VSS side (the source and the drain of the transistor 1 are provided between the functional circuit 2 and a wiring for supplying the low power source potential VSS); however, it is possible to provide the transistor 1 on the high power source potential VDD side (provide the source and the drain of the transistor 1 between the functional circuit 2 and a wiring for supplying the high power source potential VDD).

In the semiconductor device shown in FIG. 1A, the voltage (ΔV) is changed depending on the operation state of the functional circuit 2. Specifically, the voltage (ΔV) is increased when logic states of various nodes included in the functional circuit 2 are changed frequently, and decreased when not changed frequently. This is because a shoot-through current is generated when the logic states of the various nodes are changed, and the voltage (ΔV) is increased or decreased depending on the shoot-through current. Thus, it is possible for the control circuit 4 to recognize the operation state of the functional circuit 2 from the voltage (ΔV). In the semiconductor device shown in FIG. 1A, power gating is started in the case where the control circuit 4 determines from the voltage (ΔV) that the functional circuit 2 is in a non-operation state (the voltage (ΔV) is less than or equal to the predetermined voltage).

Figure 1B:
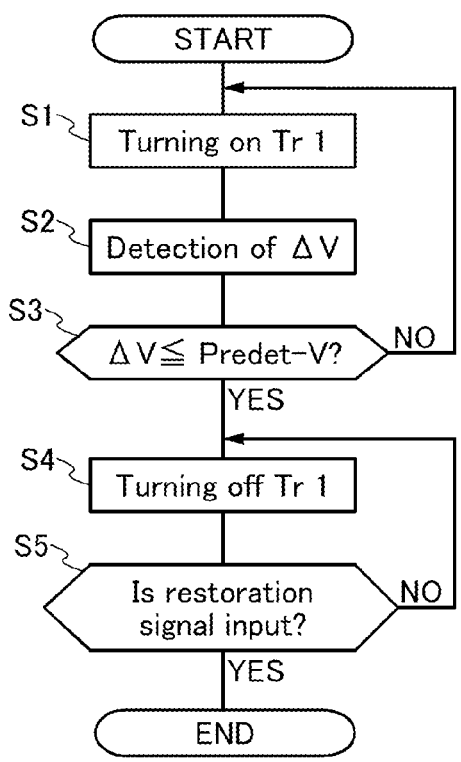
FIGS. 1B and 1C are flow charts showing examples of a driving method thereof.
Figure 1C:
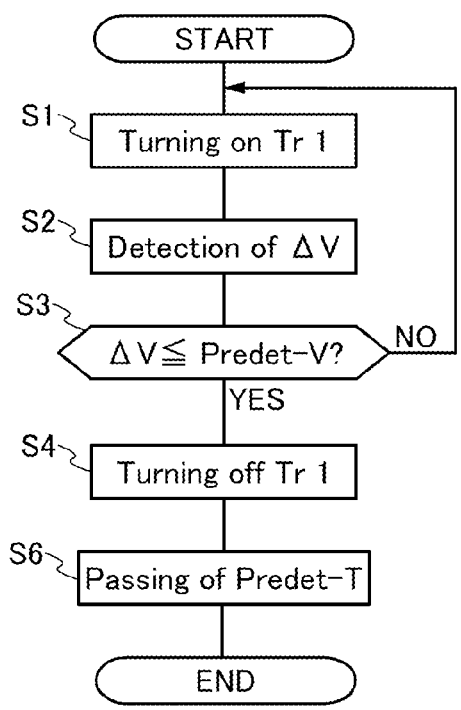

FIG. 1B is a flow chart showing an example of a driving method of the semiconductor device shown in FIG. 1A. In the case of driving the semiconductor device in accordance with the flow chart of FIG. 1B, first, the transistor 1 is turned on by the control circuit 4 to operate the functional circuit 2 (S1). Then, in a period in which the transistor 1 is on, the voltage (ΔV) is detected by the detection circuit 3 and output to the control circuit 4 (S2). Note that the voltage (ΔV) may be detected constantly or regularly in the period in which the transistor 1 is on. Alternatively, the voltage (ΔV) may be detected temporarily in the case where a signal for detecting the voltage (ΔV) is input from the control circuit 4 into the detection circuit 3 without constant or regular detection. Next, whether the voltage (ΔV) is less than or equal to the predetermined voltage (Predet-V) or not is determined by the control circuit 4 (S3). As a result, the transistor 1 is turned off by the control circuit 4 in the case where the voltage (ΔV) is less than or equal to the predetermined voltage (Predet-V) (S4), whereas the transistor 1 remains on by the control circuit 4 in the case where the voltage (ΔV) is beyond the predetermined voltage (Predet-V) (S1). In the former case, the transistor 1 remains off by the control circuit 4 until a restoration signal is input from the outside into the control circuit 4, and power gating is terminated after the restoration signal is input (S5). Note that termination of power gating means that the transistor 1 is turned on again by the control circuit 4 (S1).

FIG. 1C is a flow chart showing an example of the driving method of the semiconductor device shown in FIG. 1A, which is different from the flow chart in FIG. 1B. In the flow chart of FIG. 1C, the flow of (S1 to S4) from the step of turning on the transistor 1 to the step of turning off the transistor 1 is the same as the flow in the flow chart of FIG. 1B, and only the flow from the step of turning off the transistor 1 to the step of turning on the transistor 1 again is different. Specifically, in the case of driving the semiconductor device in accordance with the flow chart of FIG. 1C, power gating is terminated after predetermined time (Predet-T) has passed since turning off of the transistor 1 (S6).

It is possible to start power gating passively (automatically in the case where the voltage (ΔV) is less than or equal to the predetermined voltage) in the above semiconductor device. Specifically, it is possible to start power gating without a process for predicting the timing at which an arithmetic operation performed in the functional circuit 2 is terminated. As a result, it is possible to start power gating easily in the above semiconductor device.

<1-1. Transistor 1>

Figure 2:
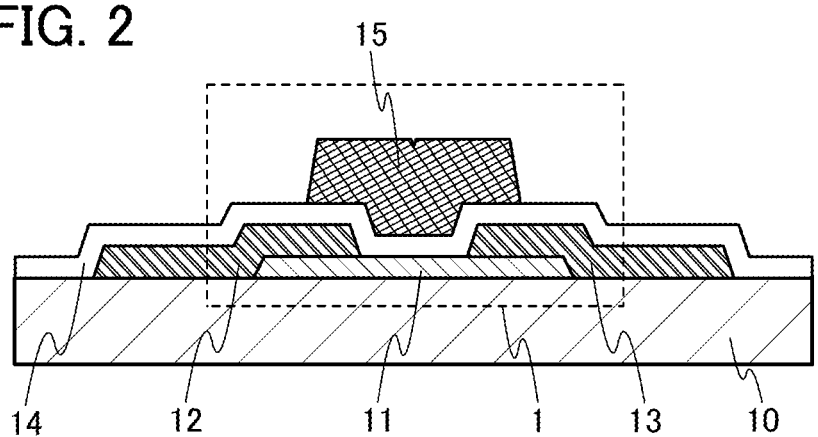
FIG. 2 shows a structure example of a transistor.

FIG. 2 is a cross-sectional view showing a structure example of the transistor 1. The transistor 1 illustrated in FIG. 2 includes a semiconductor layer 11 over a layer 10 having an insulating surface, a conductive layer 12 in contact with one end of the semiconductor layer 11, a conductive layer 13 in contact with the other end of the semiconductor layer 11, an insulating layer 14 over the semiconductor layer 11 and the conductive layers 12 and 13, and a conductive layer 15 over the insulating layer 14. Note that in the transistor 1 illustrated in FIG. 2, the conductive layers 12 and 13 function as a source and a drain, the insulating layer 14 functions as a gate insulating film, and the conductive layer 15 functions as a gate.

<1-1-1. Specific Example of Semiconductor Layer 11>

It is possible to form the semiconductor layer 11 using any of a variety of semiconductor materials. For example, a material such as silicon or germanium can be used. Alternatively, it is possible to use a compound semiconductor or an oxide semiconductor. Particularly in the case of forming the semiconductor layer 11 using the oxide semiconductor, which is preferable, it is possible to effectively reduce power consumption owing to power gating. This is because the transistor 1 where the semiconductor layer 11 is formed using the oxide semiconductor has an extremely low off-state current value. This is due to the fact that the bandgap of the oxide semiconductor is relatively wider than the bandgap of other semiconductors such as silicon, for example.

The semiconductor layer 11 formed using the oxide semiconductor is described below in detail.

<(1) Oxide Semiconductor Material>

A film containing at least indium can be used for the semiconductor layer 11. In particular, a film containing indium and zinc is preferred to be used. As a stabilizer for reducing fluctuation in electrical characteristics of the transistors, a film containing gallium (Ga) in addition to indium and zinc is preferred to be used.

Alternatively, a film which contains, as a stabilizer, one or more of tin, hafnium, aluminum, zirconium, and lanthanoid such as lanthanum, cerium, praseodymium, neodymium, samarium, europium, gadolinium, terbium, dysprosium, holmium, erbium, thulium, ytterbium, or lutetium can be used as the semiconductor layer 11.

As the semiconductor layer 11, for example, a film of any of the following oxides can be used: an indium oxide, an In—Zn-based oxide, an In—Mg-based oxide, an In—Ga-based oxide, an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Here, for example, an "In—Ga—Zn-based oxide" means an oxide containing In, Ga, and Zn as its main components and there is no particular limitation on the ratio of In, Ga, and Zn. The In—Ga—Zn-based oxide may contain a metal element other than In, Ga, and Zn.

Nitrogen may be substituted for part of constituent oxygen of the semiconductor layer 11.

<(2) Crystal Structure of Oxide Semiconductor>

A structure of an oxide semiconductor film is described below.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferred that in the CAAC-OS film, a peak of 2θ appear at around 31° and a peak of 2θ do not appear at around 36°.

In a transistor using the CAAC-OS film, change in electric characteristics due to irradiation with visible light or ultraviolet light is small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

<(3) Layer Structure of Oxide Semiconductor>

The semiconductor layer 11 can be formed using not only a single-layer oxide semiconductor film but also a layer formed of a stack having plural kinds of oxide semiconductor films. For example, a layer including at least two of an amorphous oxide semiconductor film, a polycrystalline oxide semiconductor film, and a CAAC-OS film can be used as the semiconductor layer 11.

Alternatively, a layer formed of a stack of oxide semiconductor films having different compositions can be used as the semiconductor layer 11. Specifically, a layer including a first oxide semiconductor film (hereinafter also referred to as an upper layer) which is provided on the insulating layer 14 side and a second oxide semiconductor film (hereinafter also referred to as a lower layer) which is provided on the layer 10 side and has a different composition from the first oxide semiconductor film can be used as the semiconductor layer 11.

<1-1-2. Specific Example of Conductive layers 12 and 13>

The conductive layers 12 and 13 can be formed using a film containing an element selected from aluminum, copper, titanium, tantalum, tungsten, molybdenum, chromium, neodymium, and scandium, a film of an alloy containing any of these elements, or a film of a nitride containing any of these elements. Alternatively, a stack of layers including these films can be used.

<1-1-3. Specific Example of Insulating Layer 14>

The insulating layer 14 can be formed using an inorganic insulating material film such as a silicon oxide film, a silicon nitride film, a silicon oxynitride film, a silicon nitride oxide film, an aluminum oxide film, an aluminum oxynitride film, or a gallium oxide film. Alternatively, a stack of layers including these films can be used. Note that in the case where the semiconductor layer 11 is formed using an oxide semiconductor, an aluminum oxide film is preferred to be used for the insulating layer 14. The aluminum oxide film has a high shielding (blocking) effect of preventing penetration of oxygen and impurities such as hydrogen. Therefore, when a layer including the aluminum oxide film is used as the insulating layer 14, it is possible to prevent release of oxygen from the semiconductor layer 11 and entry of impurities such as hydrogen to the semiconductor layer 11.

Alternatively, the insulating layer 14 can be formed using a film including a hafnium oxide film, an yttrium oxide film, a hafnium silicate (HfSi$_x$O$_y$ (x>0, y>0)) film, a hafnium silicate film to which nitrogen is added, a hafnium aluminate (HfAl$_x$O$_y$ (x>0, y>0)) film, or a lanthanum oxide film (i.e., a film formed of what is called a high-k material). It is possible to reduce gate leakage current by using such a film.

<1-1-4. Specific Example of Conductive Layer 15>

The conductive layer 15 can be formed using a film containing an element selected from aluminum, copper, titanium, tantalum, tungsten, molybdenum, chrome, neodymium, and scandium or a film of an alloy containing any of these elements as its component. Alternatively, the conductive layer 15 can be formed using a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film. Such a nitride film has a work function of higher than or equal to 5 eV (electron volts), preferably higher than or equal to 5.5 eV (electron volts), which enables the threshold voltage of the transistor to be positive when such a nitride film is used as the gate, so that what is called a normally-off switching element can be achieved. Alternatively, a stack of layers including these films can be used.

<1-1-5. Supplementary Note>

In the transistor 1 illustrated in FIG. 2, it is preferred to suppress entry of impurities into the semiconductor layer 11 and release of constituent element of the semiconductor layer 11. This is because the electrical characteristics of the transistor 1 are changed when such a phenomenon occurs. As a means for suppressing this phenomenon, insulating layers having a high blocking effect are provided above and below the transistor 1 (between the layer 10 having an insulating surface and the transistor 1, and over the insulating layer 14 and the conductive layer 15). For example, the insulating layers can be formed using an inorganic insulating material film such as a silicon oxide film, a silicon nitride film, a silicon oxynitride film, a silicon nitride oxide film, an aluminum oxide film, an aluminum oxynitride film, or a gallium oxide film. Alternatively, a stack of layers including these films can be used.

<1-2. Functional Circuit 2>

Figure 3A:
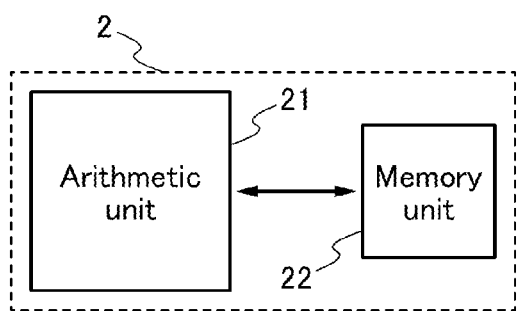
FIG. 3A is a diagram showing a structure example of a functional circuit.

FIG. 3A is a diagram showing a structure example of the functional circuit 2. The functional circuit 2 shown in FIG. 3A includes a volatile arithmetic unit 21 and a nonvolatile memory unit 22. Note that the arithmetic unit 21 has a function of performing various logic operations in the functional circuit 2. The memory unit 22 has the following functions: data held in the arithmetic unit 21 right before power gating is performed on the functional circuit 2 (logical state of a specific node) is held over a period in which power gating is performed, and the data is restored to the arithmetic unit 21 after the period.

Figure 3C:
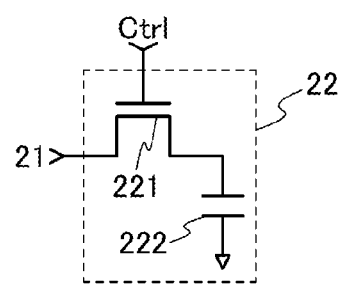
FIG. 3C is a diagram showing a structure example of a memory unit.
Figure 3B:
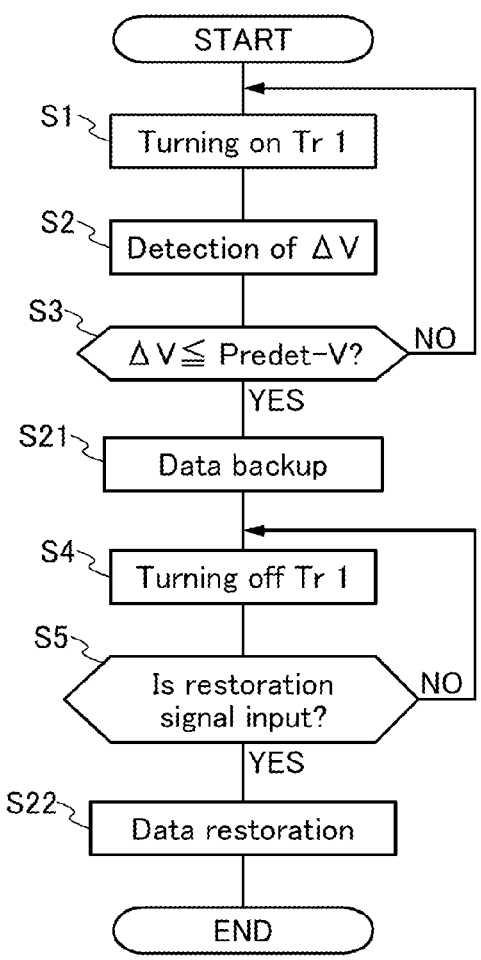
FIG. 3B is a flow chart showing an example of a driving method thereof.

FIG. 3B is a flow chart showing an example of a driving method of the semiconductor device including the functional circuit 2 shown in FIG. 3A. Note that the flow chart of FIG. 3B is a flow chart in which a step of performing backup of data from the arithmetic unit 21 to the memory unit 22 (S21) and a step of restoring the data from the memory unit 22 to the arithmetic unit 21 (S22) are added to the flow chart of FIG. 1B. Specifically, the former step (S21) is performed after the voltage (ΔV) is determined to be less than or equal to the predetermined voltage (Predet-V) (S3) and before the transistor 1 is turned off (S4), and the latter step (S22) is performed after a restoration signal is input from the outside into the control circuit 4 (S5).

When the semiconductor device is driven in accordance with the flow chart of FIG. 3B, it is possible to further suppress operation delay of the semiconductor device compared to the case where backup and restoration of data is not performed. Note that in FIG. 3B, the two steps are added to the flow chart of FIG. 1B, and it is also possible to drive the semiconductor device in accordance with a flow chart in which these two steps are added to the flow chart of FIG. 1C.

Further, it is possible to form the memory unit 22 shown in FIG. 3A using a memory unit 22 shown in FIG. 3C. The memory unit 22 shown in FIG. 3C, whose switching is controlled by a control signal (Ctrl), includes a transistor 221 whose channel is formed in an oxide semiconductor layer and a capacitor 222 whose one electrode is electrically connected to one of a source and a drain of the transistor 221. Note that the transistor 221 whose channel is formed in an oxide semiconductor layer has an extremely low off-state current. Thus, in the memory unit 22 shown in FIG. 3C, it is possible to store data over a period in which power gating is performed in a node where the one of the source and the drain of the transistor 221 and the one electrode of the capacitor 222 are electrically connected to each other. Note that the node is in a floating state by turning off the transistor 221.

Note that it is preferred to employ a structure in which a transistor whose channel is formed in an oxide semiconductor layer is used as the transistor of the memory unit 22 shown in FIG. 3A as well as the transistor 1 shown in FIG. 1A. This is because it is possible to form both the transistors in the same process.

<1-3. Detection Circuit 3>

Figure 4A:
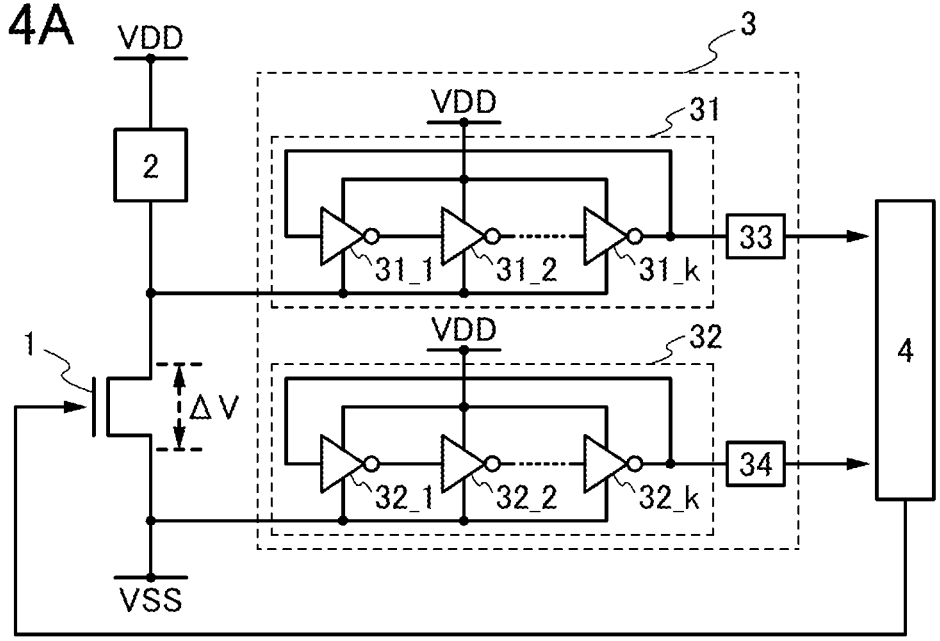
FIGS. 4A and 4B show structure examples of a detection circuit.
Figure 4B:
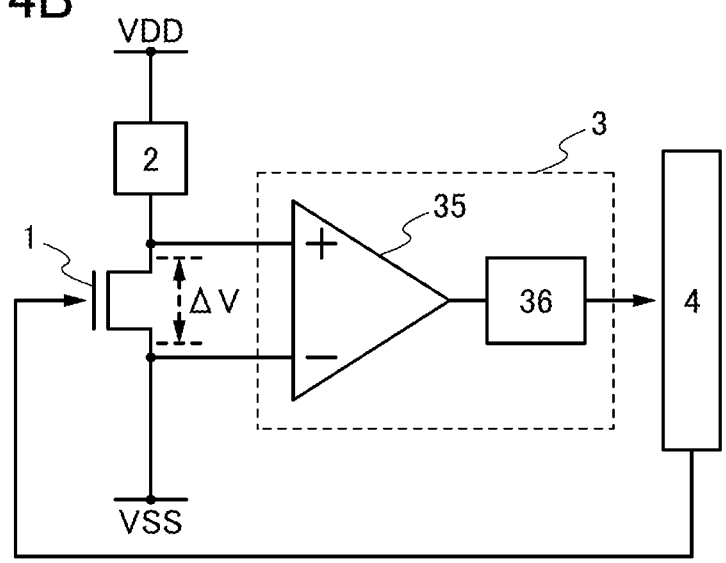

FIGS. 4A and 4B each show a structure example of the detection circuit 3. Note that in FIGS. 4A and 4B, not only the detection circuit 3 but also the transistor 1, the functional circuit 2, and the control circuit 4 are also shown.

<1-3-1. Structure Example 1>

The detection circuit 3 shown in FIG. 4A includes a ring oscillator 31 supplied with the drain potential of the transistor 1 as a low power source potential, a ring oscillator 32 supplied with the source potential of the transistor 1 as a low power source potential, a counter 33 that counts the number of oscillation clocks of the ring oscillator 31, and a counter 34 that counts the number of oscillation clocks of the ring oscillator 32. Note that in the ring oscillators 31 and 32 shown in FIG. 4A, a high power source potential (VDD) is supplied as the high power source potential. Moreover, the ring oscillator 31 includes inverters 31_1 to 31_k (k is an odd number larger than or equal to 3) which are electrically connected in series in a loop shape, and the ring oscillator 32 includes inverters 32_1 to 32_k which are electrically connected in series in a loop shape. An output of the inverter 31_k is input into the counter 33, and an output of the inverter 32_k is input into the counter 34. The numbers of oscillation clocks counted by the counters 33 and 34 are output to the control circuit 4.

The oscillation frequencies of the ring oscillators 31 and 32 shown in FIG. 4A are changed in accordance with the potentials of the low power source potentials. Then, the numbers of oscillation clocks counted by the counters 33 and 34 are changed in accordance with oscillation frequencies. Thus, it is possible that the voltage ($\Delta V$) between the source and the drain of the transistor 1 is calculated by the control circuit 4 on the basis of the numbers of oscillation clocks counted by the counters 33 and 34.

<1-3-2. Structure Example 2>

The detection circuit 3 shown in FIG. 4B includes an operation amplifier 35 into which the drain potential of the transistor 1 is input as a non-inverting input and into which the source potential of the transistor 1 is input as an inverting input, and an AD converter 36 for converting an analog signal output from the operation amplifier 35 into a digital signal. Note that the digital signal is output to the control circuit 4. Thus, it is possible that the voltage ($\Delta V$) between the source and the drain of the transistor 1 is calculated by the control circuit 4.

EXAMPLE 1

In this example, examples of a structure and a fabrication method of a semiconductor device including a transistor 902 whose channel is formed in an oxide semiconductor layer and a transistor 901 whose channel is formed in a single crystal silicon wafer will be described with reference to FIG. 5. Note that the transistor 902 can be used as the transistor 1 and the like shown in FIG. 1A, and the transistor 901 can be used as transistors included in the functional circuit 2, the detection circuit 3, the control circuit 4, and the like shown in FIG. 1A.

Note that the transistor 901 may be formed using a semiconductor material such as germanium, silicon germanium, or single crystal silicon carbide as well as silicon. For example, the transistor including silicon can be formed using a silicon thin film which is formed by an SOI method, a silicon thin film which is formed by a vapor deposition method, or the like. In that case, a glass substrate formed by a fusion process or a float process, a quartz substrate, a semiconductor substrate, a ceramic substrate, or the like can be used as a substrate. In the case where the temperature of heat treatment to be performed later is high, use of a glass substrate whose strain point is higher than or equal to 730° C. is favorable.

Figure 5:
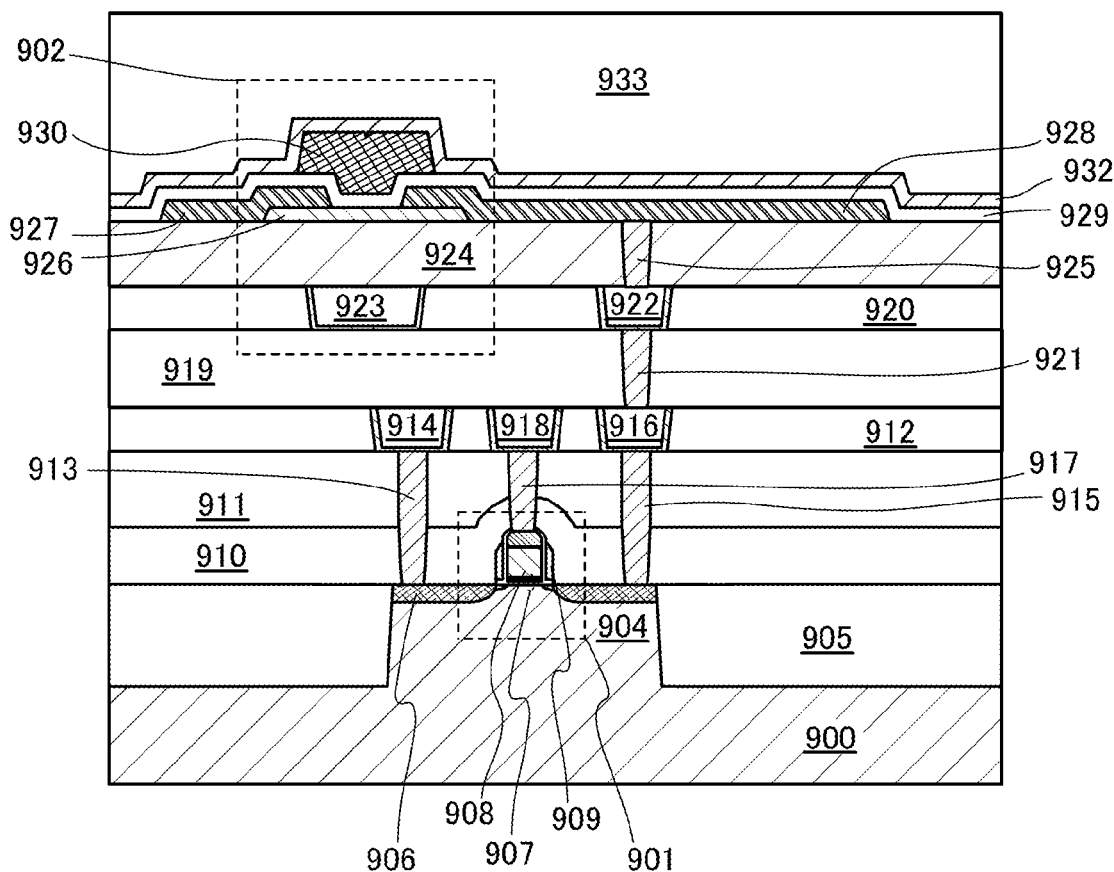
FIG. 5 illustrates a structure example of a semiconductor device.

In a semiconductor device illustrated in FIG. 5, the transistor 901 including a single crystal silicon wafer is formed, and the transistor 902 including an oxide semiconductor is formed in a level higher than the level of the transistor 901. In other words, the semiconductor device described in this example is a semiconductor device that has a three-dimensional stacked-layer structure in which a silicon wafer is used as a substrate and a transistor layer is provided above the silicon wafer. Moreover, the semiconductor device described in this example is a hybrid semiconductor device including a transistor in which silicon is used for a channel formation region and a transistor in which an oxide semiconductor is used for a channel formation region.

Either an n-channel transistor (NMOSFET) or a p-channel transistor (PMOSFET) can be used as the transistor 901 formed using a substrate 900 containing a semiconductor material. In the example shown in FIG. 5, the transistor 901 is electrically isolated from other elements by a shallow trench isolation (STI) 905. The use of the STI 905 can reduce generation of a bird's beak, which is caused by a LOCOS element isolation method, in an element isolation region, and can reduce the size of the element isolation region. On the other hand, in a semiconductor device that is not required to be structurally miniaturized or downsized, the STI 905 is not necessarily formed and an element isolation method such as LOCOS can be used. In the substrate 900 where the transistor 901 is formed, a well 904 to which an impurity imparting conductivity, such as boron, phosphorus, or arsenic, is added is formed.

The transistor 901 in FIG. 5 includes a channel formation region in the substrate 900, impurity regions 906 (also referred to as a source region and a drain region) provided such that the channel formation region is provided therebetween, a gate insulating film 907 over the channel formation region, and a gate electrode layer 908 over the gate insulating film 907 to overlap with the channel formation region. The gate electrode layer 908 can have a stacked-layer structure of a gate electrode layer including a first material for increasing processing accuracy and a gate electrode layer including a second material for reducing the resistance to be used as a wiring. For example, the gate electrode layer 908 can have a stacked-layer structure of nickel silicide and crystalline silicon to which an impurity imparting conductivity, such as phosphorus, is added. Note that the structure is not limited thereto, and materials, the number of stacked layers, the shape, or the like can be adjusted as appropriate depending on required specifications.

Note that the transistor 901 illustrated in FIG. 5 may be a fin-type transistor. In a fin-type structure, part of a semiconductor substrate is processed into a plate-shaped protrusion, and a gate electrode layer is provided to cross the protrusion in the longitudinal direction. The gate electrode layer covers an upper surface and side surfaces of the protrusion with a gate insulating film provided between the gate electrode layer and the protrusion. With the transistor 901 having a fin-type structure, the channel width can be reduced to achieve higher integration of the transistor 901. Further, a larger amount of current can flow through the transistor 901 and the control efficiency can be increased, so that the off-state current and threshold voltage of the transistor 901 can be reduced.

Contact plugs 913 and 915 are connected to the impurity regions 906 in the substrate 900. Here, the contact plugs 913 and 915 also function as a source electrode and a drain electrode of the transistor 901 to which the contact plugs 913 and 915 are connected. In addition, impurity regions that are different from the impurity regions 906 are provided between the impurity regions 906 and the channel formation region. These impurity regions function as LDD regions or extension regions for controlling the distribution of an electric field in the vicinity of the channel formation region, depending on the concentration of an impurity introduced thereto. Sidewall insulating films 909 are provided at side surfaces of the gate electrode layer 908 with an insulating film provided therebetween. By using this insulating film and the sidewall insulating films 909, the LDD regions or extension regions can be formed.

The transistor 901 is covered with an insulating film 910. The insulating film 910 can function as a protective film and can prevent impurities from entering the channel formation region from the outside. With the insulating film 910 formed by a CVD method with a material such as silicon nitride, hydrogenation can be performed by heat treatment in the case of using single crystal silicon for the channel formation region. Stress can be applied to the semiconductor material used for the channel formation region in such a manner that an insulating film having tensile stress or compressive stress is used as the insulating film 910. By application of tensile stress to a silicon material used for the channel formation region of an n-channel transistor or application of compressive stress to a silicon material used for the channel formation region of a p-channel transistor, the field-effect mobility of the transistor can be increased.

An insulating film 911 is provided over the insulating film 910, and the surface of the insulating film 911 is planarized by CMP. Accordingly, element layers in levels higher than the level including the transistor 901 can be stacked with high accuracy.

A level including the transistor 902 whose channel is formed in the oxide semiconductor layer is formed above the level including the transistor 901. The transistor 902 is a top-gate transistor and includes a source electrode layer 927 and a drain electrode layer 928 in contact with side surfaces and an upper surface of an oxide semiconductor film 926, and a gate electrode layer 930 over a gate insulating film 929 over the oxide semiconductor film 926 and the source electrode layer 927 and drain electrode layer 928. An insulating film 932 and an insulating film 933 are formed to cover the transistor 902. Here, a fabrication method of the transistor 902 is described below.

The oxide semiconductor film 926 is formed over an insulating film 924. The insulating film 924 can be formed using an inorganic insulating film of silicon oxide, silicon nitride, silicon nitride oxide, silicon oxynitride, aluminum oxide, aluminum nitride, aluminum nitride oxide, or the like. The insulating film 924 is particularly preferred to be formed using a material with a low dielectric constant (a low-k material) because capacitance due to overlap of electrodes or wirings can be sufficiently reduced. Note that the insulating film 924 may be a porous insulating film containing any of the above materials. Since the porous insulating film has lower dielectric constant than an insulating film with high density, parasitic capacitance due to electrodes or wirings can be further reduced. In this example, the insulating film 924 is a stack of a silicon oxide film with a thickness of about 300 nm on a 50-nm-thick aluminum oxide film.

The oxide semiconductor film 926 can be formed by processing an oxide semiconductor film formed over the insulating film 924 into a desired shape. The thickness of the oxide semiconductor film is larger than or equal to 2 nm and smaller than or equal to 200 nm, preferably larger than or equal to 3 nm and smaller than or equal to 50 nm, more preferably larger than or equal to 3 nm and smaller than or equal to 20 nm. The oxide semiconductor film is formed by a sputtering method using an oxide semiconductor target. Moreover, the oxide semiconductor film can be formed by a sputtering method under a rare gas (e.g., argon) atmosphere, an oxygen atmosphere, or a mixed atmosphere of a rare gas (e.g., argon) and oxygen.

Note that before the oxide semiconductor film is deposited by a sputtering method, dust on the surface of the insulating film 924 is preferred to be removed by reverse sputtering in which an argon gas is introduced and plasma is generated. The reverse sputtering refers to a method in which, without application of voltage to the target side, an RF power source is used for application of voltage to a substrate side in an argon atmosphere to generate plasma in the vicinity of the substrate to modify the surface of the insulating film 924. Note that instead of an argon atmosphere, a nitrogen atmosphere, a helium atmosphere, or the like may be used. Alternatively, an argon atmosphere to which oxygen, nitrous oxide, or the like is added may be used. Further alternatively, an argon atmosphere to which chlorine, carbon tetrafluoride, or the like is added may be used.

In this example, as the oxide semiconductor film, a 30-nm-thick In—Ga—Zn-based oxide semiconductor thin film, which is obtained by a sputtering method using a target including indium (In), gallium (Ga), and zinc (Zn), is used. As the above target, it is preferred to use a target containing In, Ga, and Zn at an atomic ratio of 1:1:1, 4:2:3, 3:1:2, 1:1:2, 2:1:3, or 3:1:4. The filling factor of the target including In, Ga, and Zn is higher than or equal to 90% and lower than or equal to 100%, preferably higher than or equal to 95% and lower than 100%. With the use of the target with high filling rate, a dense oxide semiconductor film is deposited.

In the case of using an In—Zn-based material for the oxide semiconductor film, a target containing In and Zn at an atomic ratio of 50:1 to 1:2 ($In_2O_3$:ZnO=25:1 to 1:4 in a molar ratio), preferably In and Zn at an atomic ratio of 20:1 to 1:1 ($In_2O_3$:ZnO=10:1 to 1:2 in a molar ratio), more preferably In and Zn at an atomic ratio of 1.5:1 to 15:1 at an atomic ratio ($In_2O_3$:ZnO=3:4 to 15:2 in a molar ratio) is to be used. For example, in a target used for formation of an In—Zn-based oxide semiconductor containing In, Zn, and O at an atomic ratio of X:Y:Z, the relation of Z>1.5X+Y is satisfied. The mobility can be improved by keeping the ratio of Zn within the above range.

In the case of forming an In—Sn—Zn-based oxide semiconductor film as the oxide semiconductor film by a sputtering method, it is preferred to use an In—Sn—Zn—O target containing In, Sn, and Zn at an atomic ratio of 1:1:1, 2:1:3, 1:2:2, or 20:45:35.

In this example, the oxide semiconductor film is formed in such a manner that the substrate is held in a treatment chamber kept at reduced pressure, a sputtering gas from which hydrogen and moisture have been removed is introduced to the treatment chamber while moisture remaining therein is removed, and the above-described target is used. The substrate temperature may be higher than or equal to 100° C. and lower than or equal to 600° C., preferably higher than or equal to 200° C. and lower than or equal to 400° C. during film formation. By forming the oxide semiconductor film in a state where the substrate is heated, the impurity concentration in the formed oxide semiconductor film can be reduced. In addition, damage due to sputtering can be reduced. In order to remove moisture remaining in the treatment chamber, an entrapment vacuum pump is preferred to be used. For example, a cryopump, an ion pump, or a titanium sublimation pump is preferred to be used. The evacuation unit may be a turbo pump provided with a cold trap. In the treatment chamber which is evacuated with the cryopump, for example, a hydrogen atom, a compound containing a hydrogen atom, such as water ($H_2O$), and the like are evacuated, whereby the impurity concentration in the oxide semiconductor film formed in the treatment chamber can be reduced.

As one example of the deposition conditions, the distance between the substrate and the target is 100 mm, the pressure is 0.6 Pa, the direct-current (DC) power source is 0.5 kW, and the atmosphere is an oxygen atmosphere (the proportion of the oxygen flow rate is 100%). Note that a pulsed direct-current (DC) power source is preferred because dust generated in deposition can be reduced and the film thickness can be made uniform.

Moreover, when the leakage rate of the treatment chamber of the sputtering apparatus is set to be lower than or equal to $1 \times 10^{-10}$ Pa·m$^3$/second, entry of impurities such as an alkali metal or hydride into the oxide semiconductor film that is being formed by a sputtering method can be reduced. Further, with the use of the entrapment vacuum pump as the evacuation unit, counter flow of impurities such as an alkali metal, a hydrogen atom, a hydrogen molecule, water, or hydride from the evacuation unit can be reduced.

When the purity of the target is set to be higher than or equal to 99.99%, an alkali metal, a hydrogen atom, a hydrogen molecule, water, a hydroxyl group, hydride, or the like entering the oxide semiconductor film can be reduced. In addition, when the target is used, the concentration of an alkali metal such as lithium, sodium, or potassium can be reduced in the oxide semiconductor film.

In order that the oxide semiconductor film does not contain hydrogen, a hydroxyl group, and moisture as much as possible, it is preferred that impurities such as moisture or hydrogen that are adsorbed on the substrate 900 be eliminated and evacuated by preheating the substrate 900 over which the films and the like including the insulating film 924 are formed in a preheating chamber of the sputtering apparatus, as pretreatment for deposition. The temperature for the preheating is higher than or equal to 100° C. and lower than or equal to 400° C., preferably higher than or equal to 150° C. and lower than or equal to 300° C. As an evacuation unit, a cryopump is preferred to be provided in the preheating chamber. Note that this preheating treatment can be omitted.

Note that etching for forming the oxide semiconductor film 926 may be dry etching, wet etching, or both dry etching and wet etching. As an etching gas used for dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferred to be used. Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching method, a parallel plate reactive ion etching (RIE) method or an inductively coupled plasma (ICP) etching method can be used. In order to etch the film to have a desired shape, the etching conditions (e.g., the amount of electric power applied to a coiled electrode, the amount of electric power applied to an electrode on the substrate side, and the electrode temperature on the substrate side) are adjusted as appropriate.

A resist mask used for forming the oxide semiconductor film 926 may be formed by an inkjet method. Formation of the resist mask by an inkjet method needs no photomask; thus, manufacturing cost can be reduced.

Note that it is preferred that reverse sputtering be performed before the formation of a conductive film in a subsequent step so that a resist residue and the like that are attached onto the surfaces of the oxide semiconductor film 926 and the insulating film 924 are removed.

Note that the oxide semiconductor film deposited by sputtering or the like contains in some cases a large amount of moisture or hydrogen (including a hydroxyl group) as impurities. Moisture or hydrogen easily forms donor levels and thus serves as an impurity in the oxide semiconductor. In this example, in order to reduce impurities such as moisture or hydrogen in the oxide semiconductor film 926 (in order to perform dehydration or dehydrogenation), the oxide semiconductor film 926 is subjected to heat treatment in a reduced-pressure atmosphere, an inert gas atmosphere of nitrogen, a rare gas, or the like, an oxygen gas atmosphere, or ultra-dry air (the moisture amount is less than or equal to 20 ppm (−55° C. by conversion into a dew point), preferably less than or equal to 1 ppm, more preferably less than or equal to 10 ppb in the case where measurement is performed by a dew point meter in a cavity ring-down laser spectroscopy (CRDS) method).

By performing the heat treatment on the oxide semiconductor film 926, moisture or hydrogen in the oxide semiconductor film 926 can be released. Specifically, the heat treatment may be performed at a temperature higher than or equal to 250° C. and lower than or equal to 750° C., preferably higher than or equal to 400° C. and lower than the strain point of the substrate. For example, it is favorable to perform the heat treatment at 500° C. for about three minutes to six minutes. When a rapid thermal anneal (RTA) method is used for the heat treatment, dehydration or dehydrogenation can be performed in a short time; thus, the treatment can be performed even at a temperature higher than the strain point of a glass substrate.

In this example, an electrical furnace that is one of heat treatment apparatuses is used.

Note that the heat treatment apparatus is not limited to an electric furnace, and may have a device for heating an object to be processed by heat conduction or heat radiation from a heating element such as a resistance heating element. For example, an RTA apparatus such as a gas rapid thermal anneal (GRTA) apparatus or a lamp rapid thermal anneal (LRTA) apparatus can be used. The LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. The GRTA apparatus is an apparatus for heat treatment using a high-temperature gas. As the gas, an inert gas which does not react with an object to be processed by heat treatment, like nitrogen or a rare gas such as argon, is used.

In the heat treatment, it is preferred that moisture, hydrogen, and the like be not contained in nitrogen or a rare gas such as helium, neon, or argon. Alternatively, the purity of nitrogen or a rare gas such as helium, neon, or argon which is introduced to the heat treatment apparatus is preferably greater than or equal to 6 N (99.9999%), more preferably greater than or equal to 7 N (99.99999%) (i.e., the impurity concentration is less than or equal to 1 ppm, preferably less than or equal to 0.1 ppm).

Through the above process, the concentration of hydrogen in the oxide semiconductor film 926 can be reduced and the oxide semiconductor film 926 can be highly purified. Accordingly, the oxide semiconductor film 926 can be stabilized. In addition, a transistor with high withstand voltage and an extremely small off-state current can be fabricated by using the oxide semiconductor film 926 in which the hydrogen concentration is reduced and the purity is improved. The above heat treatment can be performed at any time after the oxide semiconductor film is formed.

Next, the source electrode layer 927 and drain electrode layer 928 are formed through a photolithography process. Specifically, the source electrode layer 927 and drain electrode layer 928 can be formed in such a manner that a conductive film is formed over the insulating film 924 by a sputtering method or a vacuum evaporation method and then processed (patterned) into a predetermined shape.

In this example, a 100-nm-thick tungsten film is used for the source electrode layer 927 and drain electrode layer 928.

Note that the materials and etching conditions are adjusted as appropriate so that the oxide semiconductor film 926 is not removed as much as possible in etching of the conductive film. Depending on the etching conditions, an exposed portion of the oxide semiconductor film 926 is partly etched and thus a groove (a recessed portion) is formed in some cases.

Since the tungsten film is used as the conductive film to be the source electrode layer 927 and drain electrode layer 928 in this example, wet etching can be selectively performed on the conductive film using a solution (an ammonia hydrogen peroxide mixture) containing ammonia and hydrogen peroxide water. As the ammonia hydrogen peroxide mixture, specifically, a solution in which hydrogen peroxide water of 31 wt %, ammonia water of 28 wt %, and water are mixed at a volume ratio of 5:2:2 is used. Alternatively, dry etching may be performed on the conductive film with the use of a gas containing carbon tetrafluoride ($CF_4$), chlorine ($Cl_2$), or oxygen.

In order to reduce the numbers of photomasks and steps in the photolithography process, etching may be performed with the use of a resist mask formed using a multi-tone mask through which light is transmitted so as to have a plurality of intensities. The resist mask formed using a multi-tone mask has a plurality of thicknesses and can be changed in shape by ashing; thus, the resist mask can be used in a plurality of etching steps for processing films into different patterns. In other words, a resist mask corresponding to at least two kinds of different patterns can be formed by one multi-tone mask. Thus, the number of light-exposure masks can be reduced and the number of corresponding photolithography processes can be also reduced, whereby the process can be simplified.

Further, an oxide conductive film functioning as a source region and a drain region may be provided between the oxide semiconductor film 926 and the source electrode layer 927 and drain electrode layer 928. The material of the oxide conductive film is preferred to contain a zinc oxide as a component and is preferred not to contain an indium oxide. For such an oxide conductive film, a zinc oxide, a zinc aluminum oxide, a zinc aluminum oxynitride, a gallium zinc oxide, or the like can be used.

For example, in the case where the oxide conductive film is formed, patterning for forming the oxide conductive film and patterning for forming the source electrode layer 927 and drain electrode layer 928 may be performed concurrently.

By providing the oxide conductive film functioning as the source region and the drain region, the resistances between the oxide semiconductor film 926 and the source electrode layer 927 and drain electrode layer 928 can be reduced, so that the transistor 902 can operate at a high speed. In addition, with the oxide conductive film functioning as the source region and the drain region, the withstand voltage of the transistor can be increased.

Next, plasma treatment using a gas such as $N_2O$, $N_2$, or Ar may be performed. By this plasma treatment, water or the like adhering to an exposed surface of the oxide semiconductor film 926 is removed. Alternatively, plasma treatment using a mixture gas of oxygen and argon may be performed.

After the plasma treatment, the gate insulating film 929 is formed to cover the source electrode layer 927 and drain electrode layer 928 and the oxide semiconductor film 926. Then, the gate electrode layer 930 is formed over the gate insulating film 929 so as to overlap with the oxide semiconductor film 926.

In this example, a 20-nm-thick silicon oxynitride film formed by a sputtering method is used as the gate insulating film 929. The substrate temperature during film formation favorably ranges from room temperature to 400° C., and is 300° C. in this example.

After the gate insulating film 929 is formed, heat treatment may be performed. The heat treatment is performed in a nitrogen atmosphere, ultra-dry air, or a rare gas (e.g., argon or helium) atmosphere preferably at a temperature higher than or equal to 200° C. and lower than or equal to 400° C., for example, higher than or equal to 250° C. and lower than or equal to 350° C. The water content in the gas is preferably lower than or equal to 20 ppm, more preferably lower than or equal to 1 ppm, further preferably lower than or equal to 10 ppb. In this example, for example, the heat treatment is performed at 250° C. in a nitrogen atmosphere for an hour. Alternatively, RTA treatment for a short time at a high temperature may be performed before the formation of the source electrode layer 927 and drain electrode layer 928 in a manner similar to that of the heat treatment performed on the oxide semiconductor film 926 for reduction of moisture or hydrogen. Even when oxygen vacancies are generated in the oxide semiconductor film 926 by the previous heat treatment performed on the oxide semiconductor film 926, oxygen is supplied to the oxide semiconductor film 926 from the gate insulating film 929 by performing the heat treatment after the gate insulating film 929 containing oxygen is provided. By the supply of oxygen to the oxide semiconductor film 926, oxygen vacancies that serve as donors can be reduced in the oxide semiconductor film 926 and the stoichiometric composition can be satisfied. As a result, the oxide semiconductor film 926 can be made substantially i-type and fluctuation in electric characteristics of the transistors due to oxygen vacancies can be reduced, which results in improvement of electrical characteristics. There is no particular limitation on the timing of this heat treatment as long as it is after the formation of the gate insulating film 929. When this heat treatment also serves as heat treatment in another step, the oxide semiconductor film 926 can be made substantially i-type without an increase in the number of steps.

Alternatively, oxygen vacancies that serve as donors in the oxide semiconductor film 926 may be reduced by subjecting the oxide semiconductor film 926 to heat treatment in an oxygen atmosphere so that oxygen is added to the oxide semiconductor film 926. The heat treatment is performed at a temperature higher than or equal to 100° C. and lower than 350° C., preferably higher than or equal to 150° C. and lower than 250° C., for example. It is preferred that an oxygen gas used for the heat treatment under an oxygen atmosphere do not include water, hydrogen, or the like. Alternatively, the purity of the oxygen gas which is introduced to the heat treatment apparatus is preferably greater than or equal to 6N (99.9999%), more preferably greater than or equal to 7N (99.99999%) (i.e., the impurity concentration in the oxygen gas is less than or equal to 1 ppm, preferably less than or equal to 0.1 ppm).

Further alternatively, oxygen may be added to the oxide semiconductor film 926 by an ion implantation method, an ion doping method, or the like to reduce oxygen vacancies that serve as donors. For example, it is favorable to add oxygen that is made into a plasma state with a microwave at 2.45 GHz to the oxide semiconductor film 926.

The gate electrode layer 930 can be formed in such a manner that a conductive film is formed over the gate insulating film 929 and is then patterned.

The thickness of the gate electrode layer 930 is 10 nm to 400 nm, preferably 100 nm to 300 nm. In this example, the gate electrode layer 930 is formed in the following manner: a 135-nm-thick tungsten film is stacked over a 30-nm-thick tantalum nitride film by a sputtering method to form a conductive film for the gate electrode, and then, the conductive film is processed (patterned) into a desired shape by etching. Note that a resist mask may be formed by an inkjet method. Formation of the resist mask by an inkjet method needs no photomask; thus, manufacturing cost can be reduced.

Through the above process, the transistor 902 is formed.

Although the transistor 902 is described as a single-gate transistor, a multi-gate transistor which includes a plurality of gate electrodes electrically connected to each other so that a plurality of channel formation regions are formed can be fabricated as needed.

In the fabrication method described above, the source electrode layer 927 and drain electrode layer 928 are formed after the oxide semiconductor film 926. Accordingly, as illustrated in FIG. 5, in the transistor 902 obtained by the above fabrication method, the source electrode layer 927 and drain electrode layer 928 are formed over the oxide semiconductor film 926. Alternatively, in the transistor 902, the source electrode layer 927 and drain electrode layer 928 may be formed below the oxide semiconductor film 926, that is, between the oxide semiconductor film 926 and the insulating film 924.

Note that the insulating films in contact with the oxide semiconductor film 926 may be each formed using an insulating material containing an element that belongs to Group 13 and oxygen. Many oxide semiconductor materials contain an element that belongs to Group 13, and an insulating material containing an element that belongs to Group 13 works well with an oxide semiconductor. By using such an insulating material containing an element that belongs to Group 13 for the insulating films in contact with the oxide semiconductor film 926, the state of the interface with the oxide semiconductor film 926 can be kept well.

The insulating material containing an element that belongs to Group 13 is an insulating material containing one or more elements that belong to Group 13. As the insulating material containing an element that belongs to Group 13, a gallium oxide, an aluminum oxide, an aluminum gallium oxide, and a gallium aluminum oxide are given, for example. Here, an aluminum gallium oxide refers to a material in which the amount of aluminum is larger than that of gallium in atomic percent, and a gallium aluminum oxide refers to a material in which the amount of gallium is larger than or equal to that of aluminum in atomic percent.

For example, by using a material containing a gallium oxide for the insulating films in contact with the oxide semiconductor film 926 containing gallium, characteristics of the interfaces between the oxide semiconductor film 926 and the insulating films can be kept favorable. When the oxide semiconductor film 926 and the insulating film containing a gallium oxide are provided in contact with each other, pileup of hydrogen at the interface between the oxide semiconductor film 926 and the insulating film can be reduced, for example. Note that a similar effect can be obtained in the case where an element in the same group as a constituent element of the oxide semiconductor film 926 is used for the insulating films. For example, it is effective to form the insulating films with the use of a material including an aluminum oxide. Note that water is less likely to permeate an aluminum oxide, and it is therefore preferred to use a material containing an aluminum oxide in terms of preventing entry of water to the oxide semiconductor film 926.

The insulating films in contact with the oxide semiconductor film 926 are preferred to contain oxygen in a proportion higher than the stoichiometric composition by heat treatment in an oxygen atmosphere, oxygen doping, or the like. "Oxygen doping" refers to addition of oxygen into a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk. The oxygen doping may be performed by an ion implantation method or an ion doping method.

By the oxygen doping treatment, an insulating film that includes a region where the proportion of oxygen is higher than that in the stoichiometric composition can be formed. When the insulating film including such a region is in contact with the oxide semiconductor film 926, oxygen that exists excessively in the insulating film is supplied to the oxide semiconductor film 926, and oxygen vacancies in the oxide semiconductor film 926 or at the interface between the oxide semiconductor film 926 and the insulating film are reduced. Thus, the oxide semiconductor film 926 can be made to be i-type or substantially i-type.

Note that the insulating film including a region where the proportion of oxygen is higher than that in the stoichiometric composition may be used as either the insulating film placed above the oxide semiconductor film 926 or the insulating film placed below the oxide semiconductor film 926 of the insulating films in contact with the oxide semiconductor film 926; however, it is preferred to use such an insulating film as both of the insulating films in contact with the oxide semiconductor film 926. The above-described effect can be enhanced with a structure where the insulating films including a region where the proportion of oxygen is higher than that in the stoichiometric composition are used as insulating films placed above and below the insulating films in contact with the oxide semiconductor film 926 so that the oxide semiconductor film 926 is provided between the insulating films.

The insulating films placed above and below the oxide semiconductor film 926 may contain the same constituent elements or different constituent elements. The insulating films in contact with the oxide semiconductor film 926 may be each a stack of insulating films each including a region where the proportion of oxygen is higher than that in the stoichiometric composition.

Note that in this example, the transistor 902 has a top-gate structure. The transistor 902 includes a back-gate electrode layer 923. With the back-gate electrode layer 923, normally-off characteristics of the transistor 902 can be further achieved. For example, when the potential of the back-gate electrode layer 923 is set at GND or a fixed potential, the threshold voltage of the transistor 902 can be further shifted in the positive direction and the transistor 902 can be further a normally-off transistor.

In order to form an electrical circuit by electrically connecting the transistor 901 and the transistor 902 to each other, wiring layers for connection having a stacked-layer structure are formed.

In FIG. 5, one of a source and a drain of the transistor 901 is electrically connected to a wiring layer 914 through the contact plug 913. The other of the source and the drain of the transistor 901 is electrically connected to the drain electrode layer 928 of the transistor 902 through the contact plug 915, a wiring layer 916, a contact plug 921, a wiring layer 922, and a contact plug 925. Moreover, a gate of the transistor 901 is electrically connected to a wiring layer 918 through a contact plug 917.

The wiring layers 914, 918, and 916 are embedded in the insulating film 912, and the back-gate electrode layer 923 and the wiring layer 922 are embedded in the insulating film 920. These wiring layers and the like are preferred to be formed using a low-resistance conductive material such as copper or aluminum. Alternatively, these wiring layers can be formed using graphene formed by a CVD method as a conductive material. Graphene is a one-atom thick sheet of $sp^2$-bonded carbon molecules or a stack of 2 to 100 sheets of carbon molecules. Examples of a method for fabricating such graphene are a thermal CVD method by which graphene is formed on a metal catalyst and a plasma CVD method by which graphene is formed from methane, without using a catalyst, by plasma generated locally with ultraviolet light irradiation.

By using such a low-resistance conductive material, RC delay of signals transmitted through the wiring layers can be reduced. When copper is used for the wiring layers, a barrier film is formed in order to prevent copper from diffusing into the channel formation region. The barrier film can be a tantalum nitride film, a stack of a tantalum nitride film and a tantalum film, a titanium nitride film, or a stack of a titanium nitride film and a titanium film, for example, but is not limited to a film containing such materials as long as the film has a function of preventing diffusion of a wiring material and has adhesion to the wiring material, a base film, or the like. The barrier film may be formed as a layer that is separate from the wiring layer, or may be formed in such a manner that a material of the barrier film is included in a wiring material and precipitated by heat treatment on the inner wall of an opening provided in the insulating film.

The insulating films 911, 912, 919, 920, and 933 can be formed using an insulator such as silicon oxide, silicon oxynitride, silicon nitride oxide, borophosphosilicate glass (BPSG), phosphosilicate glass (PSG), silicon oxide to which carbon is added (SiOC), silicon oxide to which fluorine is added (SiOF), silicon oxide made from $Si(OC_2H_5)_4$ (tetraethylorthosilicate: TEOS), an insulator made from hydrogen silsesquioxane (HSQ), an insulator made from methyl silsesquioxane (MSQ), organosilicate glass (OSG), or an organic polymer-based material. In particular, in the case of advancing miniaturization of a semiconductor device, parasitic capacitance between wiring layers is significant and signal delay is increased; therefore, the insulating films 911, 912, 919, 920, and 933 are preferred to be formed using a material whose relative permittivity is less than the relative permittivity of silicon oxide (k=4.0 to 4.5), for example, a material where k is less than or equal to 3.0. In addition, CMP treatment is performed after the wiring layers are embedded in the insulating films; therefore, the insulating film needs to have high mechanical strength. As long as their mechanical strength can be secured, the insulating films can be made porous to have a lower dielectric constant. The insulating films are formed by a sputtering method, a CVD method, a coating method including a spin coating method (also referred to as spin on glass (SOG)), or the like.

An insulating film functioning as an etching stopper in the case of performing planarization treatment by CMP or the like may be additionally provided after the wiring material is embedded in the insulating films 911, 912, 919, 920, and 933.

Each of the contact plugs 913, 915, 917, 921, and 925 is formed in such a manner that an opening (a via hole) with a high aspect ratio is formed in the insulating film and is filled with a conductive material such as tungsten. The opening is preferred to be formed by highly anisotropic dry etching. In particular, a reactive ion etching (RIE) method is preferred to be used. A barrier film (diffusion prevention film) which is a titanium film, a titanium nitride film, a stacked layer of them, or the like is formed on an inner wall of the opening and a material such as tungsten or polysilicon doped with phosphorus is embedded in the barrier film. For example, tungsten can be embedded in the via hole by a blanket CVD method, and an upper surface of the contact plug is planarized by CMP.

EXAMPLE 2

The semiconductor device of one embodiment of the present invention can be used for electronic devices in a wide variety of fields, such as digital signal processing, software-defined radio systems, avionic systems (electronic devices used in aircraft, such as communication systems, navigation systems, autopilot systems, and flight management systems), ASIC prototyping, medical image processing, voice recognition, encryption, bioinformatics, emulators for mechanical systems, and radio telescopes in radio astronomy.

Examples of consumer products among such electronic devices are display devices, personal computers, and image reproducing devices provided with recording media (devices that reproduce the content of recording media such as digital versatile discs (DVDs) and have displays for displaying the reproduced images). Other examples of electronic devices that can include the semiconductor device in one embodiment of the present invention are mobile phones, game consoles including portable game consoles, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, and multifunction printers. FIGS. 6A to 6F illustrate specific examples of these electronic devices.

Figure 6A:
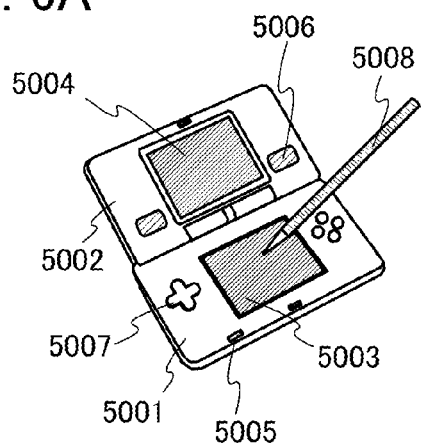
FIGS. 6A to 6F show specific examples of electronic devices.

FIG. 6A illustrates a portable game console. The portable game console illustrated in FIG. 6A includes a housing 5001, a housing 5002, a display portion 5003, a display portion 5004, a microphone 5005, a speaker 5006, an operation key 5007, a stylus 5008, and the like. Note that although the portable game console illustrated in FIG. 6A has the two display portions 5003 and 5004, the number of display portions included in the portable game console is not limited to two.

Figure 6B:
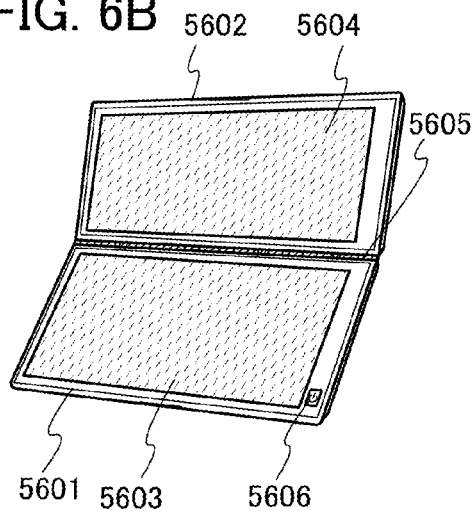

FIG. 6B illustrates a portable information terminal. The portable information terminal illustrated in FIG. 6B includes a first housing 5601, a second housing 5602, a first display portion 5603, a second display portion 5604, a connection portion 5605, an operation key 5606, and the like. The first display portion 5603 is provided in the first housing 5601, and the second display portion 5604 is provided in the second housing 5602. The first housing 5601 is connected to the second housing 5602 by the connection portion 5605, and the angle between the first housing 5601 and the second housing 5602 can be changed with the connection portion 5605. An image on the first display portion 5603 may be switched depending on the angle between the first housing 5601 and the second housing 5602 at the connection portion 5605. A display device with a position input function may be used as at least one of the first display portion 5603 and the second display portion 5604. Note that the position input function can be added by provision of a touch panel in the display device (the first display portion 5603 or the second display portion 5604). Alternatively, the position input function can be added by provision of a photoelectric conversion element called a photosensor in a pixel portion of the display device (the first display portion 5603 or the second display portion 5604).

Figure 6C:
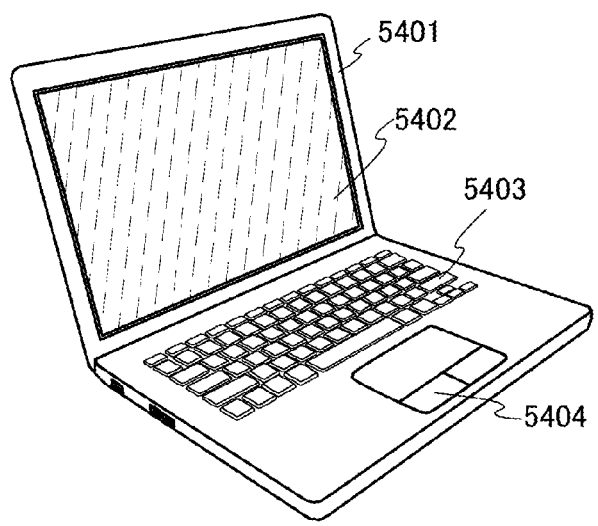

FIG. 6C illustrates a laptop personal computer. The laptop personal computer illustrated in FIG. 6C includes a housing 5401, a display portion 5402, a keyboard 5403, a pointing device 5404, and the like.

Figure 6D:
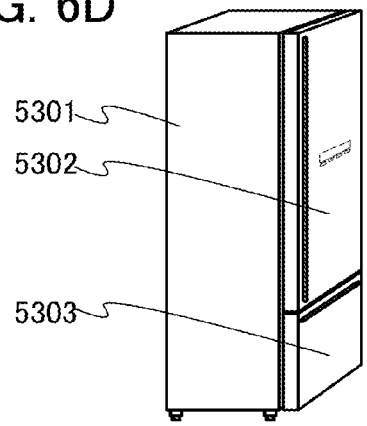

FIG. 6D illustrates an electric refrigerator-freezer. The electric refrigerator-freezer illustrated in FIG. 6D includes a housing 5301, a door for a refrigerator 5302, a door for a freezer 5303, and the like.

Figure 6E:
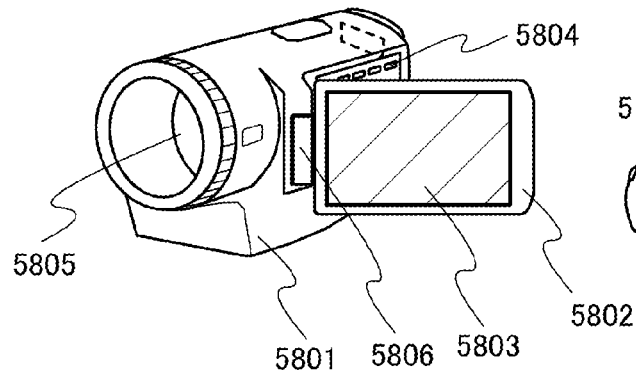

FIG. 6E illustrates a video camera. The video camera illustrated in FIG. 6E includes a first housing 5801, a second housing 5802, a display portion 5803, operation keys 5804, a lens 5805, a connection portion 5806, and the like. The operation keys 5804 and the lens 5805 are provided in the first housing 5801, and the display portion 5803 is provided in the second housing 5802. The first housing 5801 is connected to the second housing 5802 by the connection portion 5806, and the angle between the first housing 5801 and the second housing 5802 can be changed with the connection portion 5806. An image on the display portion 5803 may be switched depending on the angle between the first housing 5801 and the second housing 5802 at the connection portion 5806.

Figure 6F:
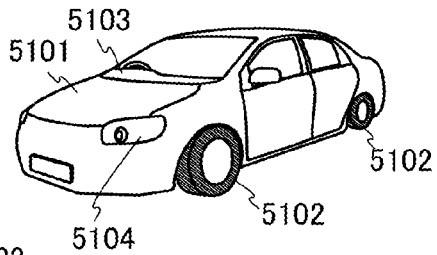

FIG. 6F illustrates an ordinary motor vehicle. The ordinary motor vehicle illustrated in FIG. 6F includes a car body 5101, wheels 5102, a dashboard 5103, lights 5104, and the like.

This application is based on Japanese Patent Application serial No. 2012-119162 filed with the Japan Patent Office on May 25, 2012, the entire contents of which are hereby incorporated by reference.

What is claimed is:

1. A semiconductor device comprising:
   a first transistor whose channel is formed in a first oxide semiconductor layer;
   a functional circuit comprising:
      a second transistor; and
      a third transistor whose channel is formed in a second oxide semiconductor layer,
   a detection circuit for detecting a voltage between a source and a drain of the first transistor; and
   a control circuit for stopping supply of a power source voltage to the functional circuit by turning off the first transistor in a first case where the voltage detected by the detection circuit is less than or equal to a predetermined voltage,
   wherein the first oxide semiconductor layer comprises a crystal structure in which a c-axis is substantially perpendicular to a surface of the first oxide semiconductor layer,
   wherein the second oxide semiconductor layer comprises a crystal structure in which a c-axis is substantially perpendicular to a surface of the second oxide semiconductor layer,
   wherein each of the first and second oxide semiconductor layers is formed by using a target, and
   wherein the target comprises indium and zinc at an atomic ratio of 50:1 to 1:2.

2. The semiconductor device according to claim 1, wherein the supply of the power source voltage to the functional circuit is resumed by turning on the first transistor in a second case where a restoration signal is input into the control circuit.

3. The semiconductor device according to claim 1, wherein the supply of the power source voltage to the functional circuit is resumed by turning on the first transistor in a third case where predetermined time has passed since turning off of the first transistor.

4. The semiconductor device according to claim 1, wherein the functional circuit comprises:
   a volatile arithmetic unit comprising the second transistor; and
   a nonvolatile memory unit comprising the third transistor,
   wherein backup of data in the volatile arithmetic unit is performed to the nonvolatile memory unit before the supply of the power source voltage to the functional circuit is stopped, and
   wherein the data in the nonvolatile memory unit is restored to the volatile arithmetic unit after the supply of the power source voltage to the functional circuit is resumed.

5. The semiconductor device according to claim 4, wherein the nonvolatile memory unit stores the data in a node which is in a floating state by turning off the third transistor for performing backup of data.

6. The semiconductor device according to claim 1, wherein the detection circuit comprises:
   a first ring oscillator supplied with a source potential of the first transistor as a low power source potential; and a second ring oscillator supplied with a drain potential of the first transistor as a low power source potential, wherein the voltage between the source and the drain of the first transistor is detected on a basis of a difference between an oscillation frequency of the first ring oscillator and an oscillation frequency of the second ring oscillator.

7. The semiconductor device according to claim 1, wherein the detection circuit comprises:

an operation amplifier including a non-inverting input terminal into which a drain potential of the first transistor is input and an inverting input terminal into which a source potential of the first transistor is input, wherein the voltage between the source and the drain of the first transistor is detected on a basis of an output of the operation amplifier.

8. The semiconductor device according to claim 1, wherein a first device layer which comprising the first transistor and the third transistor is higher than a second device layer which comprising the second transistor.

* * * * *